United States Patent
Sawai

(10) Patent No.: US 10,763,924 B2
(45) Date of Patent: Sep. 1, 2020

(54) WIRELESS COMMUNICATION SYSTEM, WIRELESS COMMUNICATION DEVICE, AND WIRELESS COMMUNICATION METHOD

(71) Applicant: SONY CORPORATION, Tokyo (JP)

(72) Inventor: Ryou Sawai, Tokyo (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/278,765

(22) Filed: Sep. 28, 2016

(65) Prior Publication Data

US 2017/0019155 A1 Jan. 19, 2017

Related U.S. Application Data

(63) Continuation of application No. 14/825,290, filed on Aug. 13, 2015, now Pat. No. 9,485,000, which is a (Continued)

(30) Foreign Application Priority Data

Aug. 24, 2007 (JP) ................................. 2007-218841

(51) Int. Cl.
  *H04B 7/0413* (2017.01)
  *H03M 13/35* (2006.01)
  (Continued)

(52) U.S. Cl.
  CPC .......... *H04B 7/0413* (2013.01); *H03M 13/35* (2013.01); *H04B 7/0697* (2013.01);
  (Continued)

(58) Field of Classification Search
  CPC .. H04B 7/0851; H04B 7/0854; H04B 7/0413; H04L 27/2601; H03M 13/35; H03M 13/356
  See application file for complete search history.

(56) References Cited

U.S. PATENT DOCUMENTS

5,502,744 A * 3/1996 Marshall ............. H04L 27/3488
                                                           375/259
7,272,394 B2 9/2007 Krishnakumar et al.
(Continued)

FOREIGN PATENT DOCUMENTS

CN      1381106 A     11/2002
JP    2005-229617       8/2005
(Continued)

OTHER PUBLICATIONS

Noh, Yujin. "Design of unequal error protection for MIMO-OFDM systems," Vehicular Technology Conference, 2005. VTC 2005—Spring. 2005 IEEE 61st, pp. 1058-1062, vol. 2, May 30-Jun. 1, 2005.*

(Continued)

*Primary Examiner* — Patrick N Edouard
*Assistant Examiner* — Eboni N Giles
(74) *Attorney, Agent, or Firm* — Paratus Law Group, PLLC

(57) ABSTRACT

A wireless communication system includes a transmitting device and a receiving device each including a plurality of antennas. A plurality of streams are subjected to spatial multiplexing and are transmitted in a downlink in which packets are transmitted from the transmitting device to the receiving device. In the transmitting device, each of the plurality of transmission streams is divided into a plurality of bit-series groups having decoding characteristics to which priority levels are assigned, the bit-series groups are subjected to encoding processes and modulating processes in accordance with the priority levels and further subjected to weighting and synthesizing, and each of the plurality of transmission streams in which a plurality of bit series items are synthesized with one another is spatially multiplexed and transmitted.

4 Claims, 12 Drawing Sheets

Related U.S. Application Data continuation of application No. 12/193,268, filed on Aug. 18, 2008, now Pat. No. 9,130,635.

(51) Int. Cl.
  *H04B 7/06* (2006.01)
  *H04B 7/08* (2006.01)
  *H04L 27/26* (2006.01)
  *H04W 84/12* (2009.01)

(52) U.S. Cl.
  CPC ............ *H04B 7/08* (2013.01); *H04B 7/0851* (2013.01); *H04B 7/0854* (2013.01); *H04L 27/2601* (2013.01); *H03M 13/356* (2013.01); *H04W 84/12* (2013.01)

(56) References Cited

U.S. PATENT DOCUMENTS

| | | | |
|---|---|---|---|
| 2005/0123138 A1* | 6/2005 | Abe | H04B 1/7113 380/255 |
| 2005/0176406 A1 | 8/2005 | Krishnakumar et al. | |
| 2006/0153062 A1* | 7/2006 | Tanabe | H04L 1/0045 370/208 |
| 2007/0263569 A1* | 11/2007 | Choi | H04B 7/0851 370/334 |
| 2007/0291855 A1 | 12/2007 | Reznic et al. | |
| 2008/0049744 A1* | 2/2008 | Kim | H04L 1/0041 370/389 |
| 2008/0080632 A1 | 4/2008 | Kim et al. | |
| 2008/0317155 A1 | 12/2008 | Reznic et al. | |
| 2009/0180495 A1 | 7/2009 | Li et al. | |
| 2010/0077275 A1* | 3/2010 | Yu | H03M 13/114 714/752 |

FOREIGN PATENT DOCUMENTS

| | | |
|---|---|---|
| JP | 2006-517063 | 7/2006 |
| JP | 2006-261982 | 9/2006 |
| JP | 2006-333283 | 12/2006 |
| WO | WO2006-033404 | 3/2006 |

OTHER PUBLICATIONS

English Translation of Japanese Patent Publication 2003-204317 (Year: 2003).*

Yujin Noh, et al., Design of Unequal Error Protection for MIMO-OFDM Systems, Dept. of Communication Engineering, Korea University, Seoul, Korea, Vehicular Technology Conference, 2005, vol. 2, pp. 1058-1062, May 30-Jun. 1, 2005.

C. Han, et al., "UEP Schemes for Multimedia Transmission in Space-Time Coded Systems", Communications, Circuits and Systems, pp. 602-606, 1/3-3/3 and cover (2007).

Notification of Reasons for Refusal, dated Oct. 25, 2011 with English language translation from the Japanese Patent Office in corresponding Japanese Patent application No. 2007-218841.

Weiling Wu, et al. UEP Schemes for Multimedia Transmission in Space-Time Coded Systems, pp. 602-606, Jul. 11-13, 2007.

* cited by examiner

WIRELESS COMMUNICATION SYSTEM, WIRELESS COMMUNICATION DEVICE, AND WIRELESS COMMUNICATION METHOD

CROSS REFERENCES TO RELATED APPLICATIONS

This application is a continuation of U.S. patent application Ser. No. 14/825,290 (filed on Aug. 13, 2015), which is a continuation of U.S. patent Ser. No. 12/193,268 (filed on Aug. 18, 2008 and issued as U.S. Pat. No. 9,130,635 on Sep. 8, 2015), which claims priority to Japanese Patent Application No. 2007-218841 (filed on Aug. 24, 2007), which are all hereby incorporated by reference in their entirety.

BACKGROUND OF THE INVENTION

1. Field of the Invention

The present invention relates to wireless communication systems, wireless communication devices, and wireless communication methods which are capable of performing spatial multiplexing transmissions on a plurality of streams on the basis of channel matrixes using channel transfer functions of pairs of a transmission antenna and a reception antenna.

The present invention particularly relates to a wireless communication system, a wireless communication device, and a wireless communication method which attain increase in transmission capacity in spatial multiplexing communication.

Specifically, the present invention relates to a wireless communication system, a wireless communication device, and a wireless communication method which attain increase in transmission capacity in spatial multiplexing communication without broadening a range of frequencies, increasing a modulation multivalued number, and increasing circuit size. The present invention particularly relates to a wireless communication system, a wireless communication device, and a wireless communication method which attain increase in transmission capacity utilizing an algorithm of an MIMO transmission method.

2. Description of the Related Art

In recent years, wireless networks have been getting attention as systems free from wiring which has been used in wired communication methods in the related art. Examples of standards of wireless LANs (Local Area Networks) include an IEEE (The Institute of Electrical and Electronics Engineers) 802.11 standard and an IEEE 802.15 standard.

For example, an IEEE 802.11 a/g standard employs an OFDM (Orthogonal Frequency Division Multiplexing) modulation method which is one of multicarrier methods. In the OFDM modulation method, since data blocks are transmitted so as to be distributed to a plurality of carriers having predetermined frequencies orthogonal to one another, the carriers have narrow bands, high frequency efficiency is attained, and high frequency selective fading resistance is obtained.

Furthermore, although the IEEE 802.11 a/g standard supports modulation methods which realize a communication speed of 54 Mbps at a maximum, there is a demand for a next-generation wireless-LAN standard which realizes a higher bit rate.

As a technique which realizes speeding-up of wireless communication, MIMO (Multi-Input Multi-Output) communication has been getting attention. MIMO communication is a communication method which employs a transmitting device and a receiving device each of which includes a plurality of antenna elements so as to realize spatially multiplexed streams. In the transmitting device, a plurality of transmission data blocks are subjected to multiplexing by performing space/time encoding, and the multiplexed transmission data blocks are distributed to a plurality of transmission antennas so as to be transmitted to channels. On the other hand, in the receiving device, signals received using a plurality of reception antennas via the channels are subjected to space/time decoding so as to obtain reception data blocks without crosstalk between streams.

According to the MIMO communication method, increased transmission capacity is obtained by increasing the number of antennas without broadening a range of frequencies. Accordingly, improved communication speed is attained. Furthermore, since space multiplexing is employed, high frequency efficiency is achieved. The MIMO method is a communication method utilizing channel characteristics, and therefore, the MIMO method is different from a simple transmission/reception adaptive array.

Here, in order to further increase the transmission capacity in the wireless communication system (that is, in order to improve the frequency efficiency), the following three methods may be employed.

(1) A range of frequencies is broadened.
(2) A modulation multivalued number is increased.
(3) The number of reception antennas is increased in order to increase the number of streams subjected to spatial multiplexing.

However, there arises the following technical problems in a case where each of the three methods is employed in the MIMO communication system in the related art.

(1) According to a frequency allocation method, frequency bands other than frequency bands in ISM (Industrial Scientific and Medical) band used in recent systems cannot be used. For example, a frequency band used in the wireless LAN systems in the related art is 20 MHz or 40 MHz.

(2) An EVM (Error Vector Magnitude) value required for an amplitude-modulation phase-modulation method of 256 QAM (Quadrature Amplitude Modulation) or more is not obtained due to imperfection of an RF circuit. Accordingly, since, in the wireless communication systems in the related art, QAM values up to 64 QAM are used, it is difficult to increase the modulation multivalued number.

(3) In a MIMO transmitting device, a size of a circuit used to perform spatial multiplexing or spatial demultiplexing linearly increases N-times or more in accordance with the number N of streams which are to be subjected to the spatial multiplexing. Furthermore, in an environment of transmission in which a transmission distance is small and an arrival angle is small, such as Indoor spaces, the number of independent channels which is expected by the MIMO is four at most.

That is, in any of three methods (1) to (3), increase in transmission capacity may not be expected.

For example, a wireless transmission device capable of further improving frequency efficiency and a transmission rate while communication quality is maintained has been proposed (refer to Japanese Unexamined Patent Application Publication No. 2003-204317, for example). In the wireless transmission device, in order to control transmission frequencies of a plurality of antennas and the number of information items to be transmitted from the plurality of antennas in accordance with conditions of transmission channels, for example, transmission of different information items from a plurality of antennas using an identical frequency (spatial multiplexing), transmission of different information items from a plurality of antennas using different frequencies (frequency multiplexing), transmission of identical information items from a plurality of antennas using an identical frequency (spatial diversity), and transmission of identical information items from a plurality of antennas using different frequencies (frequency diversity) are appropriately switched to one another in accordance with the conditions of the transmission channels.

Furthermore, a receiving device which realizes frequency efficiency increased the same times as the number of multiplexing of transmission signals, a high speed, and increased transmission capacity by multiplexing a plurality of different information signal systems on an identical frequency using a MIMO channel which realizes broadband mobile communication and by cancelling interference using a receiving device has been proposed (refer to Japanese Unexamined Patent Application Publication No. 2005-252602, for example).

Moreover, a method for obtaining increased transmission capacity in an entire MIMO communication system which transmits a plurality of streams by spatial multiplexing transmission by assigning modulation methods optimum for individual streams has been proposed (refer to Japanese Unexamined Patent Application Publication No. 2005-323217, for example).

However, in the MIMO communication systems described above, the number of antennas should be increased or modulation degrees for individual streams should be increased in order to attain increased transmission capacity. However, there is a limit to increase transmission capacity due to capability of an RF circuit and a cost problem.

SUMMARY OF THE INVENTION

It is desirable to provide an excellent wireless communication system, an excellent wireless communication device, and an excellent wireless communication method which are capable of increasing transmission capacity in spatial multiplexing communication.

Furthermore, it is desirable to provide an excellent wireless communication system, an excellent wireless communication device, and an excellent wireless communication method which are capable of increasing transmission capacity in spatial multiplexing communication without broadening a range of frequencies, increasing a modulation multivalued number, and increasing a circuit size.

Moreover, it is desirable to provide an excellent wireless communication system, an excellent wireless communication device, and an excellent wireless communication method which are capable of increasing transmission capacity using an algorithm of MIMO transmission.

According to an embodiment of the present invention, there is provided a wireless communication system including a transmitting device and a receiving device each including a plurality of antennas. A plurality of streams are subjected to spatial multiplexing and are transmitted in a downlink in which packets are transmitted from the transmitting device to the receiving device. In the transmitting device, each of the plurality of transmission streams is divided into a plurality of bit-series groups having decoding characteristics to which priority levels are assigned, the bit-series groups are subjected to encoding processes and modulating processes in accordance with the priority levels and further subjected to weighting and synthesizing, and each of the plurality of transmission streams in which a plurality of bit series items are synthesized with one another is spatially multiplexed and transmitted.

Note that the term "system" herein means logical aggregation of a plurality of devices (or functional modules which realize specific functions), and it is not important whether or not the devices or the functional modules are accommodated in a single case.

In order to further increase the transmission capacity in the MIMO communication system, a method for broadening range of frequencies, a method for increasing a modulation multivalued number, and a method for increasing the number of reception antennas in order to increase the number of streams subjected to spatial multiplexing may be taken as examples. However, sufficient effects may not be expected due to a problem of frequency allocation and a problem of implementation of an analog circuit.

On the other hand, according to the wireless communication system according to the embodiment of the present invention, transmission capacity is increased by utilizing an algorithm of the MIMO transmission in which each of transmission streams is divided into a plurality of bit series items which are divided into groups in accordance with priority levels, and data multiplexing is performed on the groups in accordance with the priority levels (that is, modulation signals are multiplexed in each of the transmission streams). Therefore, the wireless communication system is not subjected to restrictions caused by a problem of frequency allocation and a problem of implementation of an analog circuit.

Specifically, in the transmitting device, each of the plurality of transmission streams is divided into a plurality of bit-series groups having decoding characteristics to which priority levels are assigned and encoding processes and modulating processes are performed on each of the bit-series groups in accordance with the priority levels. The plurality of bit-series groups which have been subjected to encoding and modulating processes in parallel and Independently for individual groups are further subjected to weighting and synthesizing so that a single transmission stream is obtained. The transmission streams thus obtained are spatially multiplexed so that spatial-multiplexed stream signals are generated for individual transmission antenna branches and the signals are output from respective transmission antennas.

On the other hand, in the reception streams which are obtained by spatially demultiplexing signals received using reception antenna branches in the receiving device, the bit-series groups are sequentially subjected to demodulating processes and decoding processes in accordance with the priority levels. For example, in the receiving device, a process of performing the demodulating processes and the decoding processes on the reception streams which are obtained by spatially multiplexing signals and which are received using the reception antenna branches in the receiving device in accordance the priority levels, and supplying results of the demodulating and decoding processes to the reception streams so that a cancelling operation is performed is repeatedly performed so that bit series items in each of the groups are obtained in accordance with the priority levels and synthesized with one another so that original data series is reproduced.

Here, the transmitting device may include a function of inserting signal information items representing encoding methods, encoding rates, modulation methods, and weighting information for individual bit-series groups into header portions of physical layers of the transmission packets and transmitting the signal information items to the receiving device. The receiving device may decode reception signals in accordance with the signal information items inserted into the header portions of the physical layers of the received packets.

Furthermore, at least one of predetermined modulation information items such as an encoding method, an encoding rate, a modulation method, and weighting information for transmission packets may be set or a predetermined pair of modulation information items may be selected and set for communication between the transmitting device and the receiving device.

Alternatively, training information items each constituted by general bit series items may be exchanged between the transmitting device and the receiving device. The transmitting device may detect states of the transmission channels for the downlink with reference to the training information items and appropriately performs bit-series grouping, assignation of encoding methods, assignation of encoding rates, assignation of modulation methods, and setting of weight values for individual bit-series groups.

Furthermore, in a case where reversibility of statuses of the transmission channels is established between the downlink used to transmit packets from the transmitting device to the receiving device and an uplink used to transmit packets from the receiving device to the transmitting device, the transmitting device and the receiving device may appropriately perform bit-series grouping, assignation of encoding methods, assignation of encoding rates, assignation of modulation methods, and setting of weight values for individual bit-series groups while individually detecting the statues of the transmission channels so as to perform packet transmission and packet reception, respectively.

In the receiving device, the demodulating processes and the decoding processes may be performed on the bit-series groups in accordance with the priority levels of the bit-series groups in each of the reception streams obtained by spatially demultiplexing the signals received using the reception antenna branches in the receiving device by one of a zero forcing method, an MMSE method, a BLAST method, and an MLD method.

Note that the zero-forcing method is a spatial demultiplexing method for multiplexing a reception vector by an inverse matrix of a channel matrix having the number of rows corresponding to the number of transmission antennas (the number of transmission signals) and the number of columns corresponding to the number of reception antennas so as to suppress signals transmitted from other antennas.

Furthermore, the MMSE method is based on logic of maximization of a rate of a signal power to a meansquare error (a sum of a crosstalk power and a noise power), employs a concept of a noise power of the receiving device, and intentionally generates crosstalk so as to obtain a reception weighting matrix. Under a noisy environment, the MMSE method is superior to the zero-forcing method.

Moreover, the BLAST method is a spatial/time multiplexing method for performing, in a transmitting device, spatial/time encoding on a plurality of transmission data blocks to be multiplexed and distributing the plurality of transmission data blocks to the transmission antennas and transmitting them to channels, and for performing, in a receiving device, spatial/time decoding on signals corresponding to the data blocks received through the channels using a plurality of reception antennas so that the same number of reception data blocks as the original data blocks are obtained.

Furthermore, the MLD method is a method for outputting a signal obtained by estimating a transmission signal corresponding to a maximum likelihood relative to a reception signal.

When the spatial demultiplexing method described above is employed in the receiving device, reception accuracy is improved using the repetition decoders such as turbo decoders and LDPC decoders.

The turbo encoding method is an encoding method for generating a considerably long code word by connecting two RSC (Recursive Systematicconvolutional) encoders using an interleaver. Turbo decoders are configured as decoders which are used for the RSC encoders, and efficiently perform decoding processes by transmitting and receiving log-likelihood ratios.

Furthermore, the LDPC code (Low-Density Parity-Check Code) is a linear code restricted so that the number of a value "1" included in a parity check matrix is reduced, and is represented by a factor graph illustrating the relationship between a variable node and a check node. When the LDPC has a large length and randomness, a function close to Shannon limit is attained.

In the receiving device, since the number of times repetition is performed using the decoders on bit-series groups of low priority levels is reduced when compared with bit-series groups of high priority levels, reduced power consumption is attained. Alternatively, in the receiving device, when the number of times repetition is performed using the decoders on bit-series groups of the high priority levels is reduced when compared with the bit-series groups of the low priority levels, improvement of a decoding characteristic is attained. Furthermore, the receiving device may perform spatial demultiplexing based on a layered cancel method and perform decoding processes on the reception streams in a descending order of the SN ratios.

Furthermore, in the wireless communication system according to the embodiment of the present invention, encoding methods having excellent decoding characteristics such as turbo encoding and LDPC encoding may be applied to the bit-series groups of the high priority levels whereas encoding methods employing parity check encoding or convolutional encoding having a high encoding rate may be applied to the bit-series groups of the low priority levels.

Furthermore, in the wireless communication system according to the embodiment of the present invention, weighting with a low modulation degree or weighting with a high amplitude level may be performed on the bit-series groups of the high priority levels whereas weighting with a high modulation degree or weighting with a low amplitude level may be performed on the bit-series groups of the low priority levels, for example, so that wireless communication is performed by assigning modulation methods for obtaining weights of bits in accordance with the priority levels to bit-series groups having different priority levels.

Moreover, in the wireless communication system according to the present invention, a value obtained as a sum of power levels of signals in which encoding and modulating processes are performed on bit-series groups of lower priority levels and noise levels thereof is assumed as a noise level in bit-series groups of higher priority levels. Accordingly, the transmitting device may set an amplitude level to such an extent that the bit series items are demodulated using the receiving device, and perform weighting on the bit series items before transmission.

Here, before transmission and reception of data packets between the transmitting device and the receiving device, an RTS/CTS communication procedure may be performed so that noise levels are notified between the transmitting device and the receiving device using the RTS/CTS procedure. Furthermore, weighting of a low demodulation level and a high amplitude level may be performed on the bit-series groups of high priority levels whereas weighting of a high demodulation level and a low amplitude level may be performed on the bit-series groups of low priority levels.

According to the embodiment of the present invention, an excellent wireless communication system, an excellent wireless communication device, and an excellent wireless communication method which are capable of increasing transmission capacity in spatial multiplexing communication are provided.

Furthermore, according to the embodiment of the present invention, an excellent wireless communication system, an excellent wireless communication device, and an excellent wireless communication method which are capable of increasing transmission capacity in spatial multiplexing communication without broadening a range of frequencies, increasing a modulation multivalued number, and increasing a circuit size are provided.

Moreover, according to the embodiment of the present invention, an excellent wireless communication system, an excellent wireless communication device, and an excellent wireless communication method which are capable of increasing transmission capacity using an algorithm of MIMO transmission are provided.

In the MIMO communication systems in the related art, the number of antennas should be increased or modulation degrees for individual streams should be increased in order to attain increased transmission capacity. However, there is a limit to increase transmission capacity due to capability of an RF circuit and a cost problem. To address this disadvantage, according to the wireless communication system according to the embodiment of the present invention, use of the algorithm of the MIMO transmission which multiplexes modulation signals in the transmission streams attains increase in the transmission capacity.

According to the embodiment of the present invention, a MIMO transmission link having a high SN ratio is attained. Furthermore, the signals multiplexed in each of the transmission streams are demultiplexed using repetitive decoders such as turbo decoders and LDPC decoders in the receiving device.

Further features and advantages of the present invention will become apparent from the following description of exemplary embodiments with reference to the attached drawings.

DESCRIPTION OF THE PREFERRED EMBODIMENTS

Embodiments of the present invention will be described hereinafter with reference to the accompanying drawings.

Figure 1:
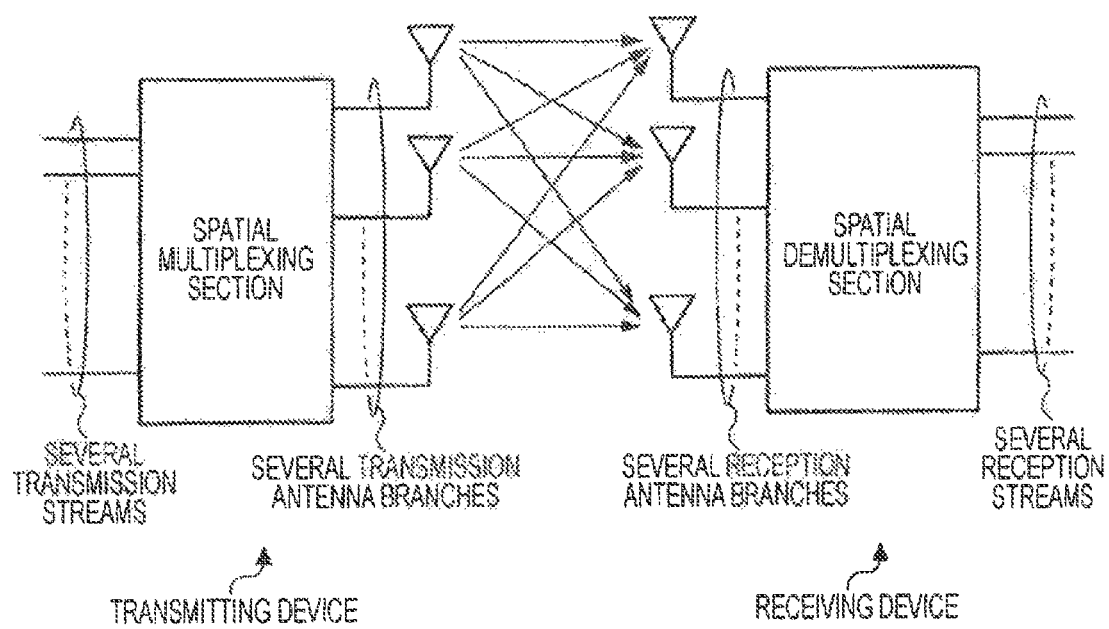
FIG. 1 is a diagram schematically illustrating a configuration of a MIMO communication system.

FIG. 1 is a diagram schematically illustrating a configuration of a MIMO communication system. The system shown in FIG. 1 includes a transmitting device and a receiving device each including a plurality of antennas.

In terms of packet transmission, the transmitting device corresponds to an initiator, and the receiving device corresponds to a receiver, whereas in terms of beam forming, the transmitting device (initiator) corresponds to a beamformer which performs spatial multiplexing on a plurality of streams so as to transmit packets, and the receiving device (receiver) corresponds to a beamformee which receives the packets which have been subjected to beam forming (spatial multiplexing). Hereinafter, a direction of communication from the beamformer to the beamformee is referred to as a "normal direction" or a "downlink" whereas a direction of communication from the beamformee to the beamformer is referred to as a "reverse direction" or an "uplink".

In the transmitting device, a transmission data series to be transmitted in response to a transmission request from an upper level protocol (not shown) is divided into data series items corresponding to a plurality of transmission streams, and the transmission streams are subjected to spatial multiplexing in a spatial multiplexing section so that spatial-multiplexed stream signals are generated for individual transmission antenna branches. These spatial-multiplexed stream signals are transmitted from the transmission antenna branches to transmission channels.

On the other hand, in the receiving device, after signals are received in reception antenna branches, the received signals are subjected to spatial demultiplexing so that a plurality of reception streams are obtained. Then, the plurality of reception streams are synthesized with one another so that original data series is reproduced, and the data series is transmitted to the upper-layer protocol (not shown). In the receiving device, the received signals are subjected to the spatial demultiplexing by a zero forcing method, an MMSE (Minimum Mean Squared Error) method, a BLAST (Bell Laboratories Layered Space-Time) method, or an MLD ((Maximum Likelihood Detection) method, for example.

Note that the zero-forcing method is a spatial demultiplexing method for multiplexing a reception vector by an inverse matrix of a channel matrix having the number of rows corresponding to the number of transmission antennas (the number of transmission signals) and the number of columns corresponding to the number of reception antennas so as to suppress signals transmitted from other antennas.

The MMSE method is based on logic of maximization of a rate of a signal power to a meansquare error (a sum of a crosstalk power and a noise power), employs a concept of a noise power of the receiving device, and intentionally generates crosstalk so as to obtain a reception weighting matrix. Under a noisy environment, the MMSE method is superior to the zero-forcing method.

The BLAST method is a spatial/time multiplexing method for performing, in a transmitting device, spatial/time encoding on a plurality of transmission data blocks to be multiplexed and distributing the plurality of transmission data blocks to the transmission antennas and transmitting them to channels, and for performing, in a receiving device, spatial/time decoding on signals corresponding to the data blocks received through the channels using a plurality of reception antennas so that the same number of reception data blocks as the original data blocks are obtained.

Furthermore, the MLD method is a method for outputting a signal obtained by estimating a transmission signal corresponding to a maximum likelihood relative to a reception signal.

Figure 2A:
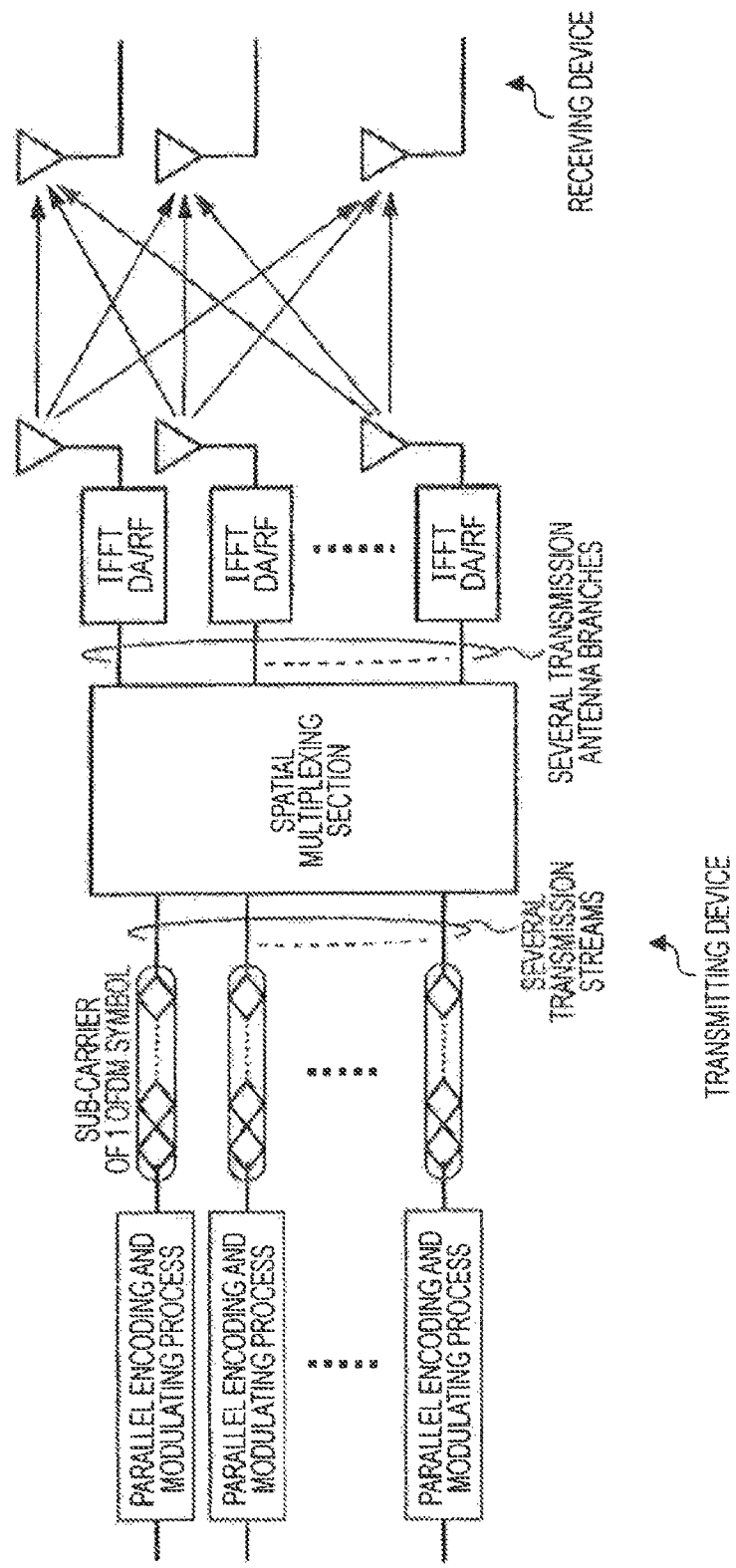
FIG. 2A is a diagram illustrating a configuration of a transmitting device in the MIMO communication system which performs encoding and modulating processes separately for individual streams in parallel.
Figure 2B:
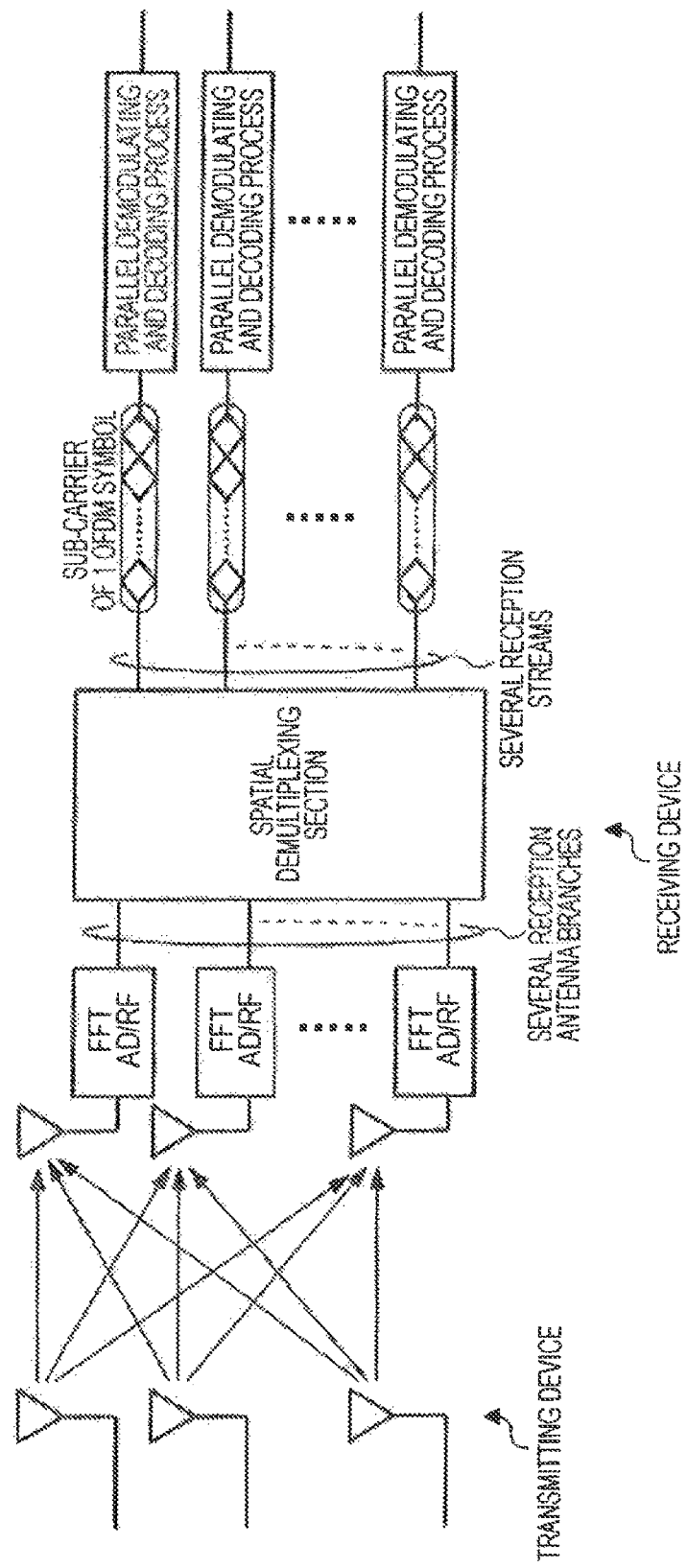
FIG. 2B is a diagram illustrating a configuration of a receiving device in the MIMO communication system which performs demodulating and decoding processes separately for individual streams in parallel.

In the wireless communication system according to the embodiment of the present invention, encoding and modulating processes or demodulating and decoding processes are performed in parallel and performed for individual streams. FIG. 2A is a diagram illustrating a configuration of a transmitting device in the MIMO communication system which performs encoding and modulating processes separately for individual streams in parallel. FIG. 2B is a diagram illustrating a configuration of a receiving device in MIMO communication system which performs demodulating and decoding processes separately for individual streams in parallel.

In the transmitting device, transmission data series to be transmitted in response to a transmission request from an upper level protocol (not shown) is divided into data series items corresponding to a plurality of transmission streams, and the plurality of transmission streams are subjected to encoding and modulating processes for individual transmission streams in parallel. Subsequently, the data series items serially transmitted are subjected to serial/parallel conversion for each symbol cycle which is longer than a cycle corresponding to an information transmission rate so that OFDM symbols in which a plurality of data blocks are assigned to sub-carriers are obtained. The sub-carriers have frequencies orthogonal to one another in each symbol period. (Note that the term "frequencies orthogonal to one another" means a condition in which a peak point of a spectrum of an arbitrary sub-carrier corresponds to a zero point of a spectrum of another sub-carrier and crosstalk does not occur.) The transmission streams each including the plurality of sub-carriers are synthesized with one another by being subjected to the spatial multiplexing so as to generate spatial-multiplexed stream signals which are to be transmitted to corresponding transmission antenna branches. Thereafter, the signals are converted from the sub-carriers in an axis of frequency into signals in a time axis through IFFT (Inverse Fast Fourier Transform), and further up-converted through DA conversion and RF conversion into wireless signals. Then, the wireless signals are transmitted from the transmission antenna branches to transmission channels.

On the other hand, in the receiving device, the reception signals received in the reception antenna branches are down-converted through RF conversion and further subjected to AD conversion. Thereafter, the signals in the time axis are converted into a plurality of sub-carriers in the axis of frequency through a FFT (Fast Fourier Transform) method, data series items for the individual reception antennas branches are reproduced through parallel/serial conversion, and data series items for the individual reception streams are obtained through the spatial demultiplexing (described above). The reception streams are individually subjected to demodulating and decoding processes in parallel and are synthesized with one another so that original data series is reproduced. The data series is supplied to the upper-layer protocol (not shown).

The wireless communication system according to the embodiment of the present invention employs a multi-level encoding method to be performed in accordance with priority levels and a multi-level modulating method to be performed in accordance with priority levels, and accordingly, transmission capacity is increased. According to the embodiment of the present invention, since the transmission capacity is increased (or frequency efficiency is improved) making use of the algorithm of the MIMO transmission, the wireless communication system is not subjected to restrictions caused by a problem of frequency allocation and a problem of implementation of an analog circuit.

Figure 3:
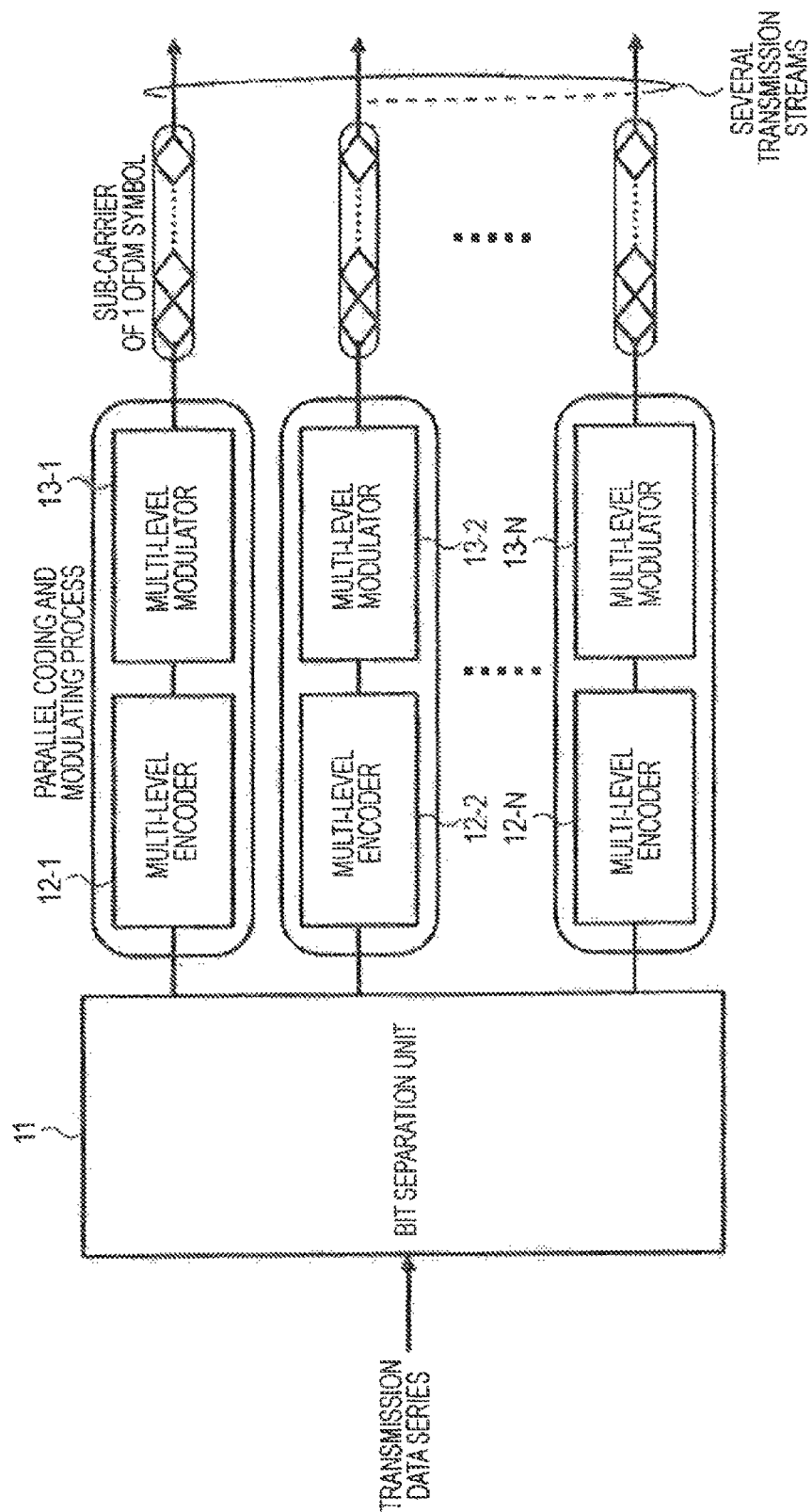
FIG. 3 is a diagram mainly illustrating a configuration of a portion in the vicinity of function blocks of the encoding and modulating processes in the transmitting device in which a plurality of levels of encoding methods in accordance with priority levels and a plurality of levels of modulating methods in accordance with priority levels are employed for the individual transmission streams.

FIG. 3 is a diagram mainly illustrating a configuration of a portion in the vicinity of function blocks of encoding and modulating processes in the transmitting device in which the multi-level encoding method in accordance with priority levels and the multi-level modulating method in accordance with priority levels are applied to the individual transmission streams.

In the transmitting device shown in FIG. 3, data series to be transmitted in response to a transmission request from the upper-layer protocol (not shown) is divided into data series items corresponding to a plurality of transmission streams using a bit separation unit 11, and the transmission streams are separately subjected to multi-level encoding processes using multi-level encoders 12 in accordance with priority levels and are separately subjected to the multi-level modulating processes using multi-level modulators 13 in accordance with priority levels.

Subsequently, the data series items serially transmitted are subjected to serial/parallel conversion for each symbol cycle which is longer than a cycle corresponding to an information transmission rate so that OFDM symbols in which a plurality of data blocks are assignee to sub-carriers are obtained. The sub-carriers have frequencies orthogonal to one another in each symbol period (as described above).

Figure 4:
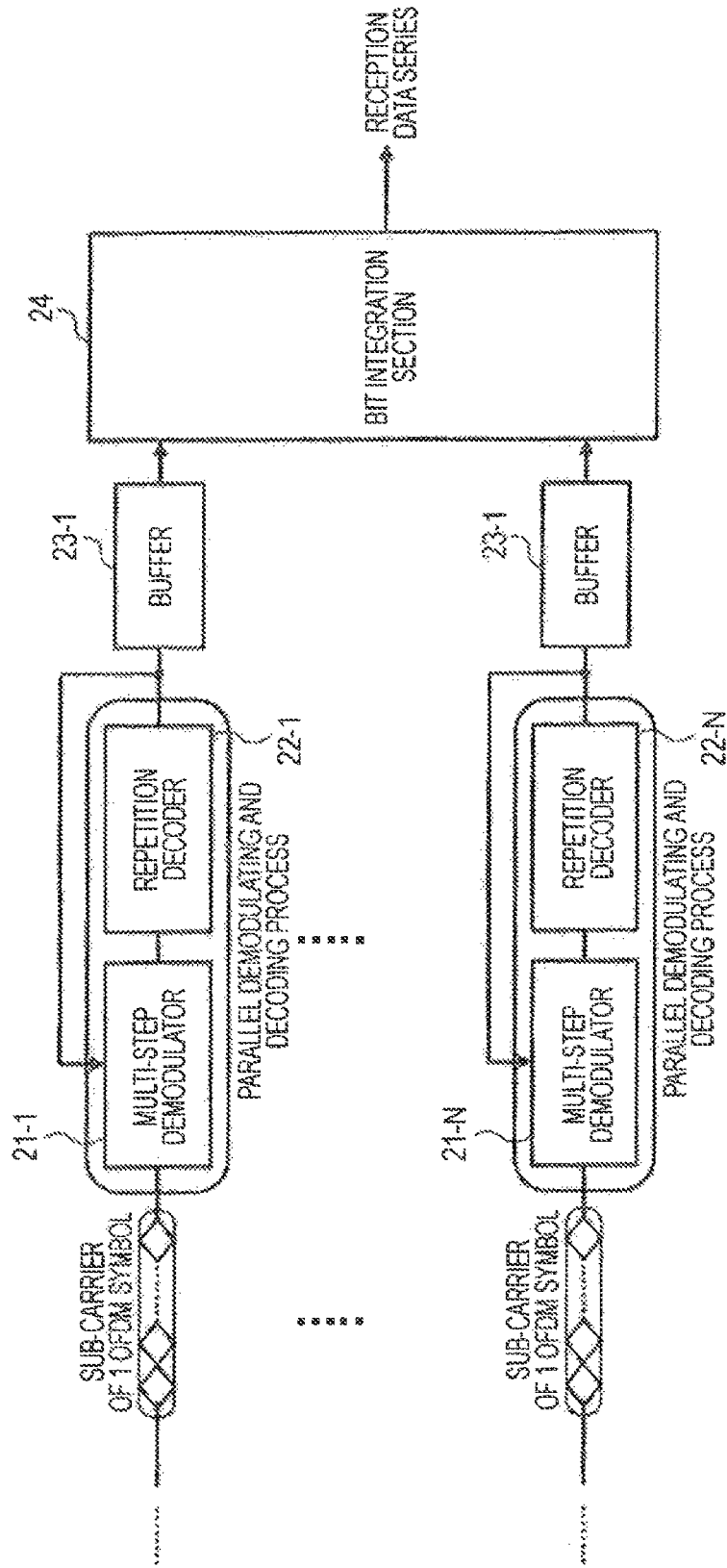
FIG. 4 is a diagram illustrating a configuration of a portion in the vicinity of function blocks of the demodulating and decoding processes in the receiving device which receives the spatially multiplexed streams transmitted from the transmitting device shown in FIG. 3.

FIG. 4 is a diagram illustrating a configuration of a portion in the vicinity of function blocks of demodulating and decoding processes in the receiving device which receives the spatially multiplexed streams transmitted from the transmitting device shown in FIG. 3.

In the receiving device, the reception signals received using the reception antenna branches are subjected to RF processing, the AD conversion, and the FFT, and furthermore, subjected to the spatial demultiplexing (described above) so that a plurality of reception streams are obtained. Data series items for the reception streams correspond to OFDM symbols in which a plurality of data blocks are assigned to the sub-carriers. Multi-step demodulators 21 individually perform demodulating processes in parallel and repetitive decoders 22 individually perform decoding processes in parallel.

The repetitive decoders 22 may employ a turbo encoding method or an LDPC encoding method. The turbo encoding method is an encoding method for generating a considerably long code word by connecting two RSC (Recursive Systematicconvolutional) encoders using an interleaver. Turbo decoders are configured as decoders which are used for the RSC encoders, and efficiently perform decoding processes by transmitting and receiving log-likelihood ratios. Furthermore, the LDPC code is a linear code restricted so that the number of a value "1" included in a parity check matrix is reduced, and is represented by a factor graph illustrating the relationship between a variable node and a check node. When the LDPC has a large length and randomness, a function close to Shannon limit is attained.

The data series items of the reception streams which have been demodulated and decoded are supplied to a bit integration section 24 through buffers 23. The bit integration section 24 synthesizes the data series items of the reception streams with one another so as to obtain original data series, and transmits the data series to the upper-layer protocol (not shown).

Figure 5:
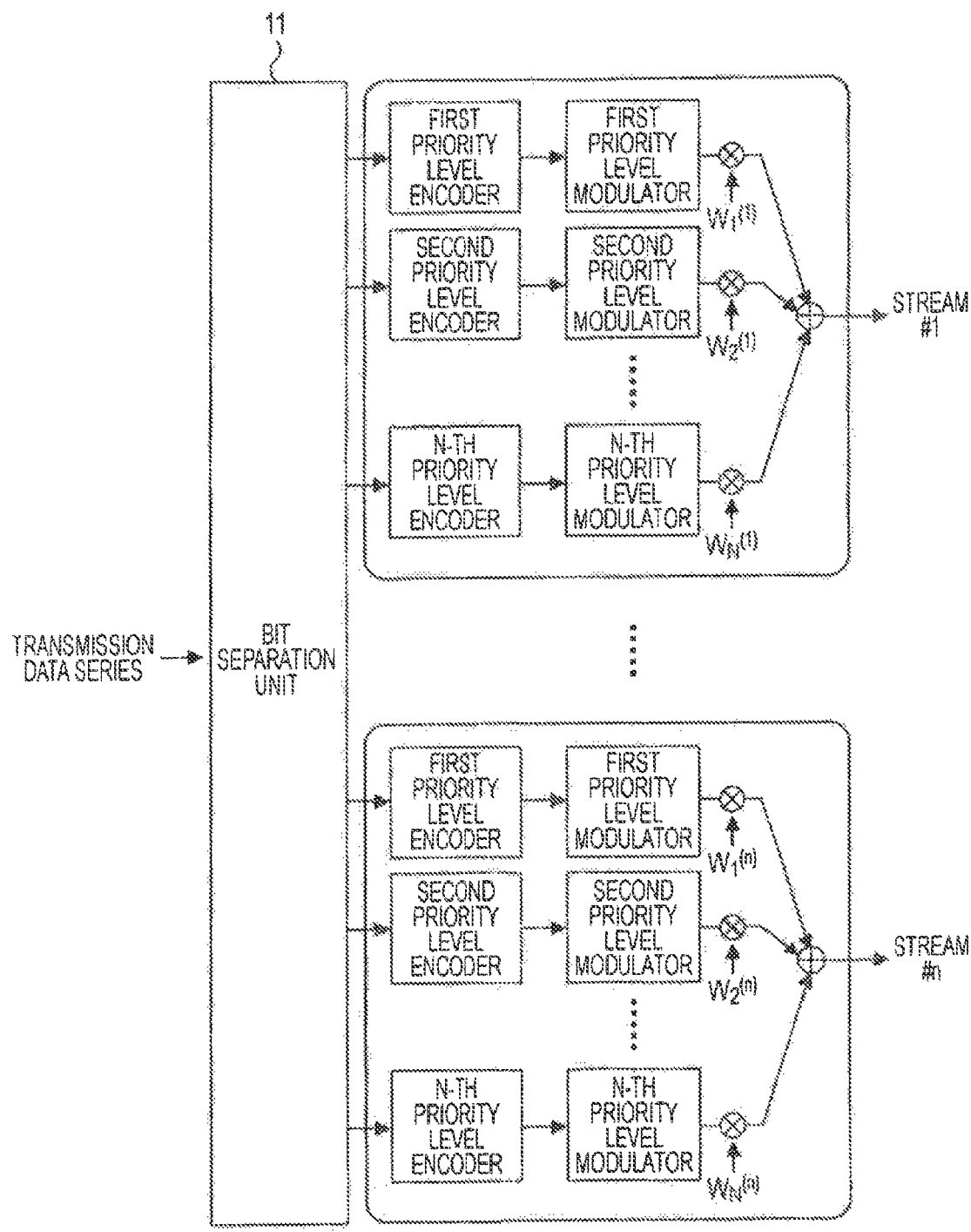
FIG. 5 is a diagram illustrating configurations of multi-level encoders and multi-level modulators included in the transmitting device shown in FIG. 3 in detail.

FIG. 5 is a diagram illustrating configurations of the multi-level encoders 12 and the multi-level modulators 13 included in the transmitting device shown in FIG. 3 in detail. Note that although a first transmission stream is taken as an example in FIG. 5, the other transmission streams have function blocks of encoding and modulating processes the same as those of the first transmission stream.

The bit separation unit 11 divides data series to be transmitted in response to a transmission request from the upper-layer protocol into the data series items corresponding to the plurality of transmission streams. In addition, the bit separation unit 11 divides each of the data series items corresponding to the plurality of transmission streams into N bit-series groups of 1 to N priority levels (note that N is an integer number equal to or more than 2).

In each of the transmission streams, the bit-series groups having different priority levels are subjected to encoding processes in parallel in accordance with the priority levels using a first priority level encoder to an N-th priority level encoder and subjected to modulating processes in parallel in accordance with the priority levels using a first priority level modulator to an N-th priority level modulator. Each of the priority level modulators has an encoding method and an encoding rate in accordance with a corresponding priority level. Each of the priority level modulators employs a modulation method having a modulation degree and an amplitude level in accordance with a corresponding priority level.

In each of the bit-series groups, bit series items of the first to the N-th priority levels which have been subjected to the encoding processes and the modulating processes in parallel in accordance with the priority levels are further subjected to weighting processes using weight factors $W_1^{(i)}$ to $W_N^{(i)}$ (note that "i" represents sequential numbers of the transmission streams) in accordance with the priority levels of the bit series items, and thereafter, the bit series items are synthesized with one another so that a single stream is obtained.

That is, data multiplexing is further performed on the transmission streams by synthesizing the bit series items of the different priority levels with one another.

As described above, spatial-multiplexed stream signals are generated for individual transmission antenna branches through spatial multiplexing performed on the transmission streams which have been subjected to the data multiplexing, and the stream signals are transmitted from the transmission antenna branches to the transmission channels.

Figure 6:
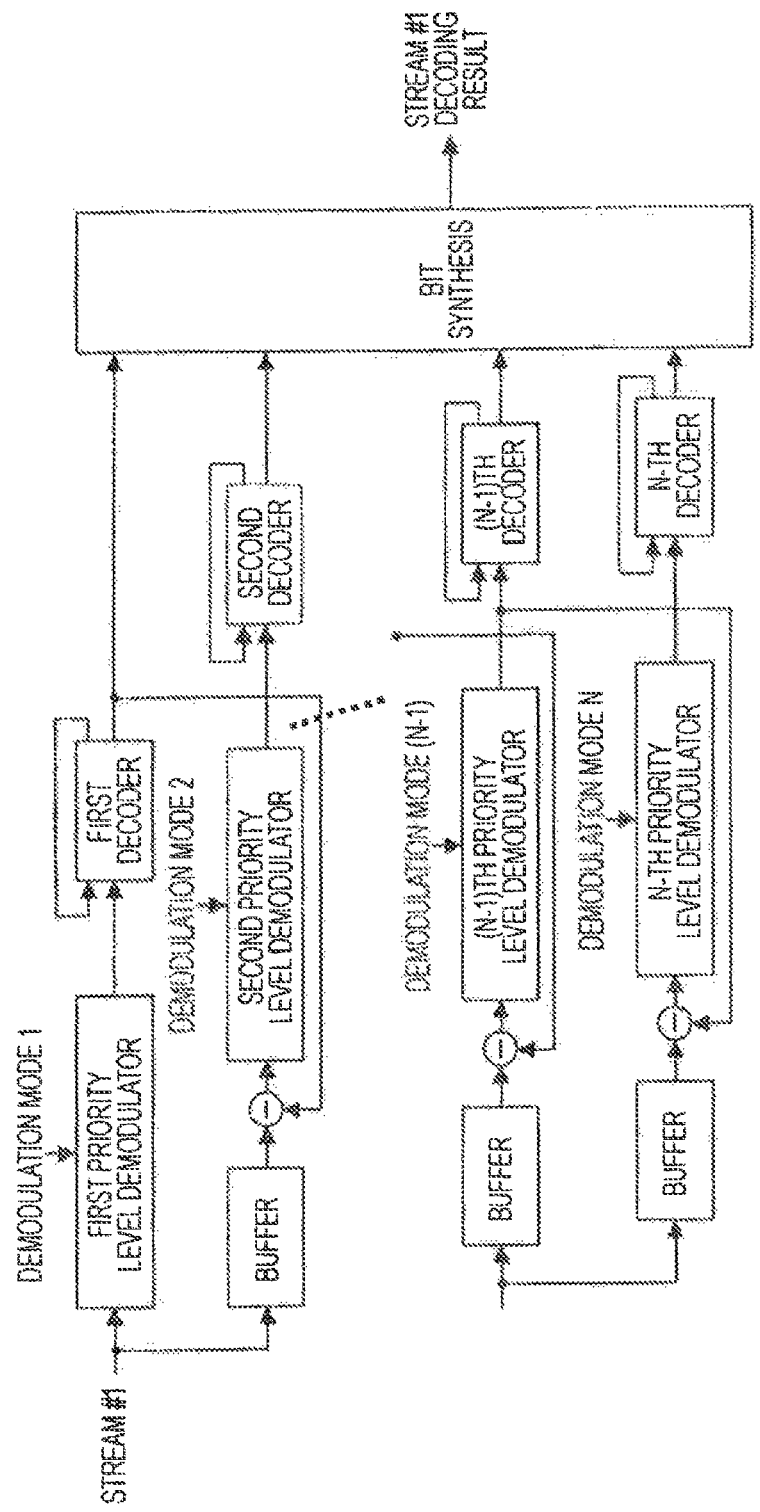
FIG. 6 is a diagram illustrating configurations of multi-step demodulators and repetitive decoders included in the receiving device shown in FIG. 4 in detail.

FIG. 6 is a diagram illustrating configurations of the multi-step demodulators 21 and the repetitive decoders 22 included in the receiving device shown in FIG. 4 in detail. Note that although the first transmission stream is taken as an example in FIG. 6, the other transmission streams have function blocks of decoding and demodulating processes the same as those of the first transmission stream.

Each of the multi-step demodulators 21 shown in FIG. 4 includes a first priority level demodulator to an N-th priority level demodulator. The priority level demodulators perform demodulating processes for the modulating methods employed in the corresponding first to N-th modulators.

The repetitive decoders 22 shown in FIG. 4 includes a first decoder to an N-th decoder. The decoders perform decoding processes for the encoding methods employed in the corresponding first to N-th priority level encoders.

The reception signals received using the reception antenna branches are subjected to the RF processing, the AD conversion, and the FFT, and furthermore, subjected to the spatial demultiplexing so that a plurality of reception streams are obtained (as described above).

The decoding processes and the demodulating processes are performed on the reception streams in accordance with the priority levels, and a process of supplying results of the decoding and demodulating processes to the reception streams so that a cancelling operation is performed is repeatedly performed. By this, bit series items in groups are obtained and synthesized with one another so that original data series is reproduced.

Specifically, when one of the reception streams is input, the first priority level demodulator demodulates the input reception stream, and the first decoder decodes the demodulated reception stream, whereby a bit series item of a first priority level is obtained. Furthermore, the input stream is temporarily stored in a buffer, cancels a result of the demodulating and decoding processes performed first which is output from the first decoder, and is input in the second priority level demodulator. A result of demodulation performed using the second priority level demodulator is decoded using the second decoder so that a bit series item of a second priority level is obtained.

Similarly, a signal obtained by canceling an (i−1)th input stream using a result of an (i−1)th decoding and demodulating processes is input to an i-th priority level demodulator, and a result of demodulation performed using the i-th priority level demodulator is decoded using an i-th decoder so that a bit-series group of an i-th priority level is obtained. The processes similar to this process are repeatedly performed until a bit series item of an N-th priority level is obtained (note that "i" is an integer selected from among 2 to N). Then, bit series items of the first to N priority levels are synthesized with one another so that original data series of a corresponding one of the reception streams is reproduced.

As described above, according to the wireless communication system including the transmitting device shown in FIG. 5 and the receiving device shown in FIG. 6, transmission capacity is increased by utilizing the algorithm of the MIMO transmission in which each of transmission streams is divided into a plurality of bit series items which are divided into groups in accordance with priority levels, and data multiplexing is performed on the groups in accordance with the priority levels (that is, modulation signals are multiplexed in each of the transmission streams). In addition, a MIMO transmission link having a high SN ratio is attained. Furthermore, the signals multiplexed in each of the transmission streams are demultiplexed using repetitive decoders such as turbo decoders and LOPC decoders in the receiving device.

Note that the encoding methods, encoding rates, demodulation methods, and weighting information of the transmitting device should correspond to those of the receiving device for individual bit-series groups.

Therefore, the transmitting device may include a function of inserting signal information items representing the encoding methods, the encoding rates, the modulation methods, and the weighting information for individual bit-series groups into header portions of physical layers of transmission packets and transmitting the signal information items to the receiving device. In this case, the receiving device decodes reception signals in accordance with the signal information items inserted into the header portions of the physical layers of the received packets.

Alternatively, predetermined modulation information items (the encoding methods, the encoding rate, the modulation methods, and weighting information) for transmission packets may be set between the transmitting device and the receiving device.

Alternatively, training information items each constituted by general bit series items may be exchanged between the transmitting device and the receiving device. In this case, the transmitting device detects states of the transmission channels for the downlink with reference to the training information items and appropriately performs bit-series grouping, assignation of the encoding methods, assignation of the encoding rates, assignation of the modulation methods, and setting of weight values for individual bit-series groups.

Furthermore, in a case where reversibility of statuses of the transmission channels is established between the downlink used to transmit packets from the transmitting device to the receiving device and the uplink used to transmit packets from the receiving device to the transmitting device, the transmitting device and the receiving device appropriately perform the bit-series grouping, the assignation of the encoding methods, the assignation of the encoding rates, the assignation of the modulation methods, and the setting of weight values for individual bit-series groups while individually detecting the statues of the transmission channels so as to perform packet transmission and packet reception, respectively.

As described above, as the spatial demultiplexing method, the zero forcing method, the MMSE method, the BLAST method, or the MLD method may be employed, and in each of the reception streams, the demodulating processes and the decoding processes are performed on the bit-series groups in accordance with priority levels.

Moreover, when the spatial demultiplexing method described above is employed in the receiving device, reception accuracy is improved using the repetition decoders such as turbo decoders and LDPC decoders.

In the receiving device, since the number of times repetition is performed using the decoders on bit-series groups of low priority levels is reduced when compared with bit-series groups of high priority levels, reduced power consumption is attained. Alternatively, in the receiving device, when the number of times repetition is performed using the decoders on bit-series groups of the high priority levels is reduced when compared with the bit-series groups of the low priority levels, improvement of a decoding characteristic is attained. Furthermore, the receiving device may perform spatial demultiplexing based on a layered cancel method and perform decoding processes on the reception streams in a descending order of the SN ratios.

Furthermore, in the wireless communication system according to the embodiment of the present invention, encoding methods having excellent decoding characteristics such as turbo encoding and LDPC encoding may be applied to the bit-series groups of the high priority levels whereas encoding methods employing parity check encoding or convolutional encoding having a high encoding rate may be applied to the bit-series groups of the low priority levels.

Furthermore, in the wireless communication system according to the embodiment of the present invention, weighting with a low modulation degree or weighting with a high amplitude level may be performed on the bit-series groups of the high priority levels whereas weighting with a high modulation degree or weighting with a low amplitude level may be performed on the bit-series groups of the low priority levels, for example, so that wireless communication is performed by assigning modulation methods for obtaining weights of bits in accordance with the priority levels to bit-series groups having different priority levels.

Moreover, in the wireless communication system according to the present invention, a value obtained as a sum of power levels of signals in which encoding and modulating processes are performed on bit-series groups of lower priority levels and noise levels thereof is assumed as a noise level in bit-series groups of higher priority levels. Accordingly, the transmitting device may set an amplitude level to such an extent that the bit series items are demodulated using the receiving device, and perform weighting on the bit series items before transmission.

Here, before transmission and reception of data packets between the transmitting device and the receiving device, an RTS/CTS (request to send/clear to send) communication procedure may be performed so that noise levels are notified between the transmitting device and the receiving device using the RTS/CTS procedure. The RTS/CTS procedure is one of methodologies for maintaining communication quality in a communication environment in which random access is performed on the bases of carrier detection.

Furthermore, weighting of a low demodulation level and a high amplitude level may be performed on the bit-series groups of high priority levels whereas weighting of a high demodulation level and a low amplitude level may be performed on the bit-series groups of low priority levels.

As described above, as the spatial demultiplexing method, the zero forcing method, the MMSE method, the BLAST method, or the MLD method may be employed. In particular, the MLD method is a method for estimating transmission signals having large likelihoods relative to reception signals and outputting the transmission signals.

Figure 7:
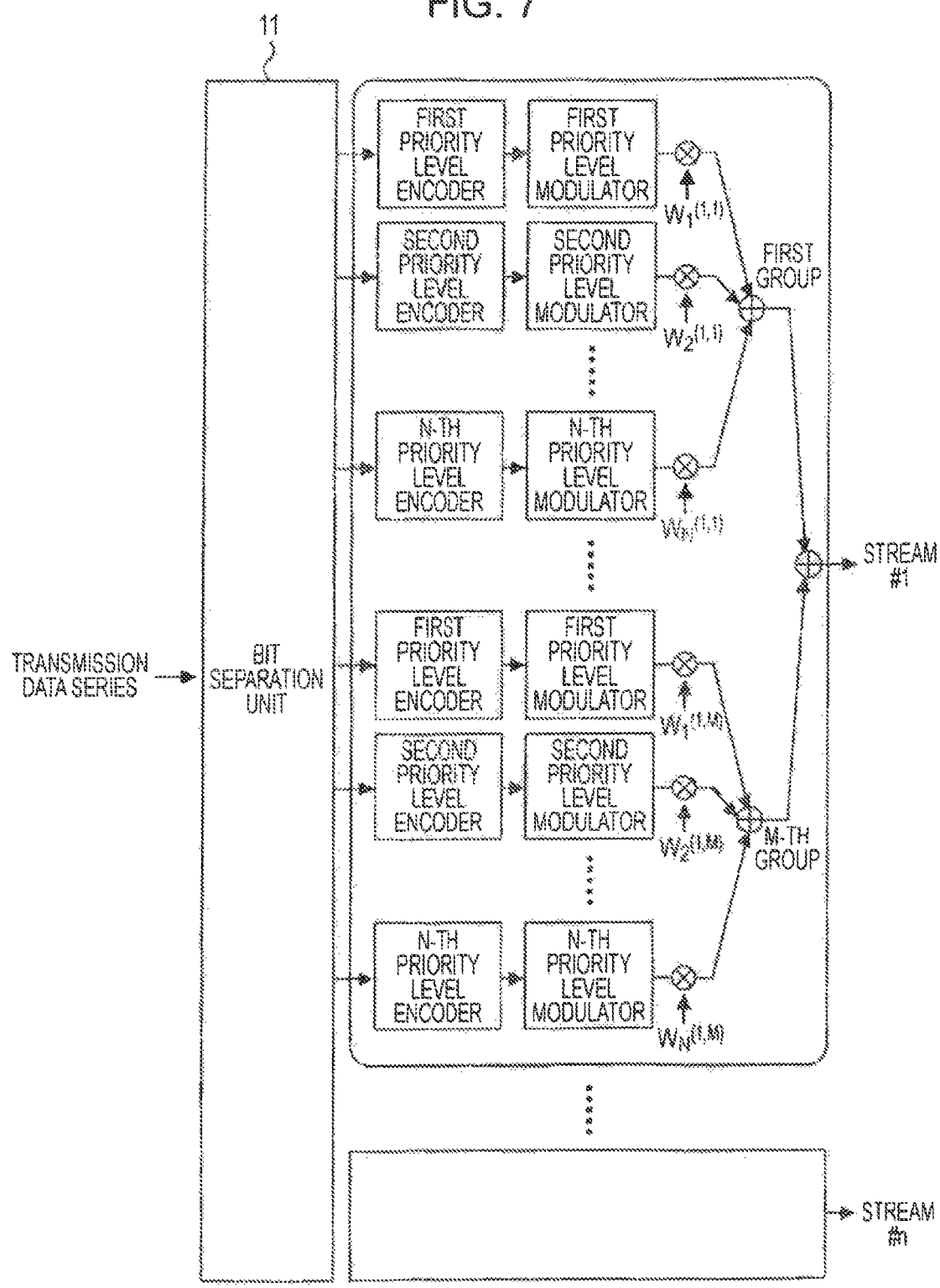
FIG. 7 is a diagram illustrating a modification example of a configuration of the transmitting device in a case where an MLD is employed in spatial demultiplexing in the receiving device.

FIG. 5 shows a configuration example of the transmitting device and FIG. 7 shows a modification example of a configuration of the transmitting device employed when the MLD method is used as the spatial demultiplexing in the receiving device. Note that although the first transmission stream is taken as an example in FIG. 7, the other transmission streams have function blocks of encoding and modulating processes the same as those of the first transmission stream.

The bit separation unit 11 divides data series to be transmitted in response to a transmission request from the upper-layer protocol into data series items corresponding to the plurality of transmission streams. In addition, the bit separation unit 11 divides each of the data series items corresponding to the plurality of transmission streams into N bit-series groups of 1 to N priority levels (note that N is an integer number equal to or more than 2).

The configuration of the transmitting device shown in FIG. 7 is the same as that of FIG. 5 in that bit series items are extracted one by one from different groups having different priority levels and encoding and modulating processes are performed on N bit series items as a unit.

In the example shown in FIG. 5, the bit separation unit 11 distributes N bit series items as a unit extracted one by one from the different groups having different priority levels to a corresponding one of the transmission streams. On the other hand, in the transmitting device shown in FIG. 7, the bit separation unit 11 distributes M groups of N bit series items extracted one by one from the different groups having different priority levels to a corresponding one of the transmission streams (note that M is an integer number equal to or more than 2).

The bit series items having different priority levels in each of first to M-th groups are subjected to encoding processes using first to N-th priority level encoders and subjected to modulating processes using first to N-th priority level modulators, respectively, in accordance with the priority levels.

Then, the N bit series items in each of the first to M-th groups which have been subjected to the encoding and modulating processes are subjected to weighting using weighting factors $W_1^{(i,j)}$ to $W_N^{(i,j)}$ in accordance with the priority levels of the bit series items (note that (i,j) represents a group in which a j-th bit series item assigned to an i-th transmission stream), and thereafter, streams obtained by synthesizing the bit series items in each of the groups are further synthesized with one another so that a transmission stream is obtained. In this case also, since the bit series items having different priority levels are synthesized, data multiplexing is further performed on transmission streams.

Accordingly, spatial multiplexing stream signals for individual transmission antenna branches are generated by performing spatial multiplexing as data multiplexing on the transmission streams and are transmitted from the transmission antenna branches to the transmission channels (as described above).

Figure 8:
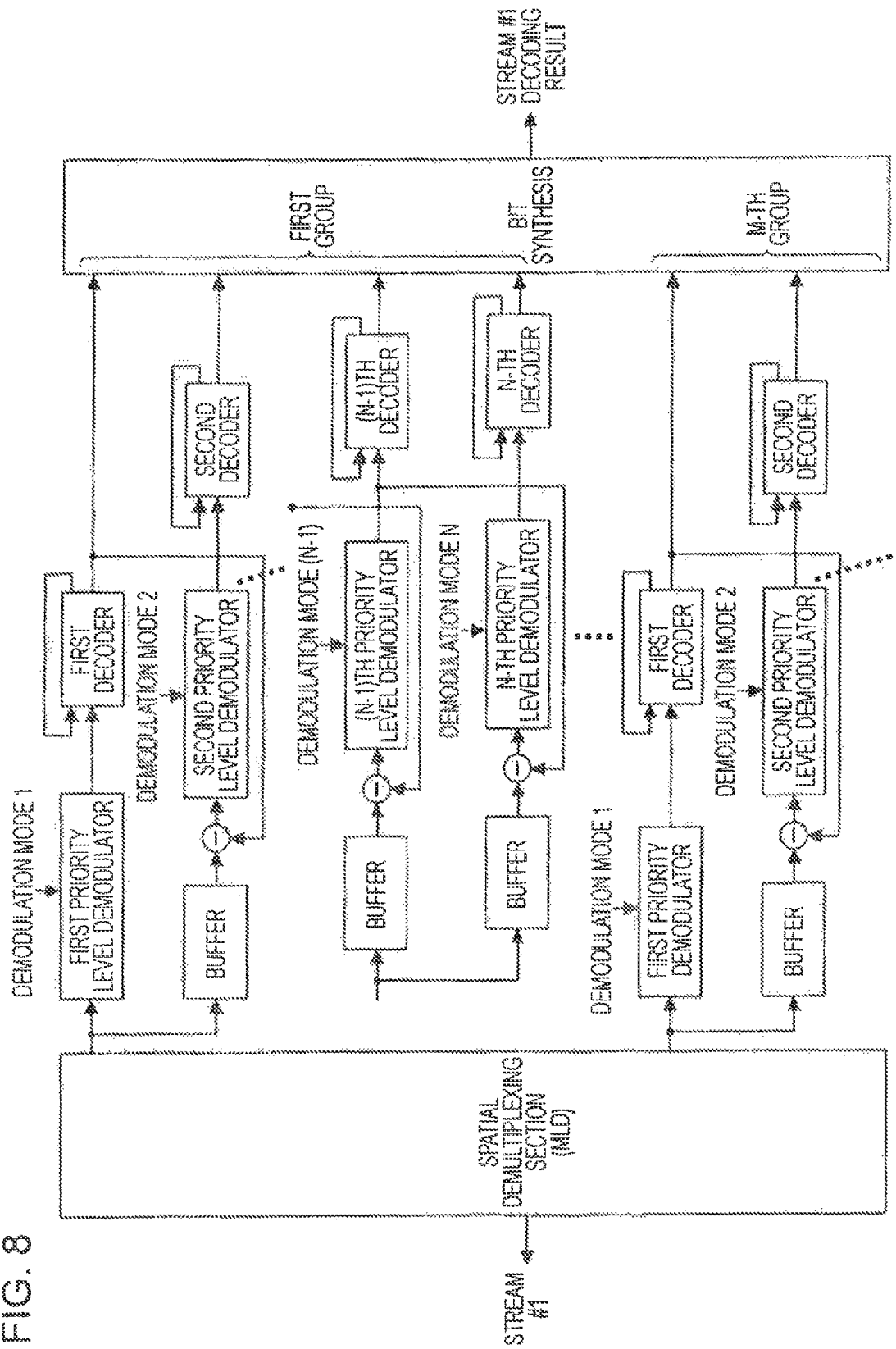
FIG. 8 is a diagram illustrating a modification example of a configuration of the receiving device in a case where the MLD is employed in the spatial demultiplexing in the receiving device.

FIG. 6 shows a configuration example of the receiving device and FIG. 8 shows a modification example of a configuration of the receiving device employed when the MLD method is used as the spatial demultiplexing in the receiving device. Note that although the first transmission stream is taken as an example in FIG. 8, the other transmission streams have function blocks of encoding and modulating processes the same as those of the first transmission stream.

The configuration of the transmitting device shown in FIG. 8 is the same as that of FIG. 6 in that the bit series items having different priority levels are extracted one by one from different groups and encoding and modulating processes are performed on N bit series items as a unit.

In the example shown in FIG. 6, the decoding and demodulating processes are performed on each of the reception streams in accordance with the priority levels, and a process of supplying results of the decoding and demodulating processes to the reception streams so that a cancelling operation is performed is repeatedly performed. In this way, N bit series items which are reproduced one by one from groups of different priority levels are obtained as a unit for each reception stream. On the other hand, in the receiving device shown in FIG. 8, since the M groups of streams obtained by synthesizing the weighted N bit series items one another are multiplexed to one another, the decoding processes or the demodulating processes are performed in accordance with the priority levels for each group, and M groups including N bit series items are obtained for individual reception streams. Then, the M groups each including the N bit series items are synthesized with one another, and a single original stream is reproduced.

In each of the first to M groups, the multi-step demodulators 21 shown in FIG. 4 includes a first priority level demodulator to an N-th priority level demodulator, and furthermore, the priority level demodulators perform demodulating processes for the modulating methods employed in the first priority level modulator to the N-th priority level modulator, respectively.

Furthermore, in each of the first to M groups, the repetitive decoders 22 shown in FIG. 4 includes a first priority level decoder to an N-th priority level decoder, and furthermore, the priority level decoders perform decoding processes for the encoding methods employed in the first priority level encoder to the N-th priority level encoder, respectively.

The reception signals received using the reception antenna branches are subjected to the RF processing, the AD conversion, and the FFT, and furthermore, subjected to the spatial demultiplexing so that a plurality of reception streams are obtained (as described above).

The decoding processes and the demodulating processes are performed on the first to M-th groups of each of the reception streams in accordance with the priority levels, and a process of supplying results of the decoding and demodulating processes to the reception streams so that a cancelling operation is performed is repeatedly performed. By this, the bit series items in each of the groups are obtained and synthesized with one another so that original data series is reproduced.

Specifically, in each of the first to M-th groups, when one of the reception stream is input, the first priority level demodulator demodulates the input reception stream, and the first decoder decodes the demodulated reception stream, whereby a bit series item of a first priority level is obtained. Furthermore, the input stream is temporarily stored in a buffer, cancels a result of the demodulating and decoding processes performed first which is output from the first decoder, and is input in the second priority level demodulator. A result of demodulation performed using the second priority level demodulator is decoded using the second decoder so that a bit series item of a second priority level is obtained.

Similarly, in each of the first to M-th groups, a signal obtained by canceling an (i−1)th input stream using a result of an (i−1)th decoding and demodulating processes is input to an i-th priority level demodulator, and a result of demodulation performed using the i-th priority level demodulator is decoded using an i-th decoder so that a bit-series group of an i-th priority level is obtained. The processes similar to this process are repeatedly performed until a bit series item of an N-th priority level is obtained (note that "i" is an integer selected from among 2 to N). Then, the bit series items of the first to N priority levels obtained in each of the first to M-th groups are synthesized with one another so that original data series of the reception stream of interest is reproduced.

As described above, according to the wireless communication system including the transmitting device shown in FIG. 7 and the receiving device shown in FIG. 8, transmission capacity is increased by utilizing the algorithm of the MIMO transmission in which each of transmission streams is divided into a plurality of bit series items in accordance with priority levels and data multiplexing is performed in accordance with the priority levels (that is, modulation signals are multiplexed in each of the transmission streams). In addition, a MIMO transmission link having a high SN ratio is attained. Furthermore, the signals multiplexed in each of the transmission streams are demultiplexed using repetitive decoders such as turbo decoders and LDPC decoders in the receiving device.

Lastly, a methodology for multiplexing a plurality of bit series items having decoding characteristics of different priority levels in each of transmission streams, that is, a methodology for multiplexing a plurality of modulation signals in each of transmission streams will be described.

Figure 9:
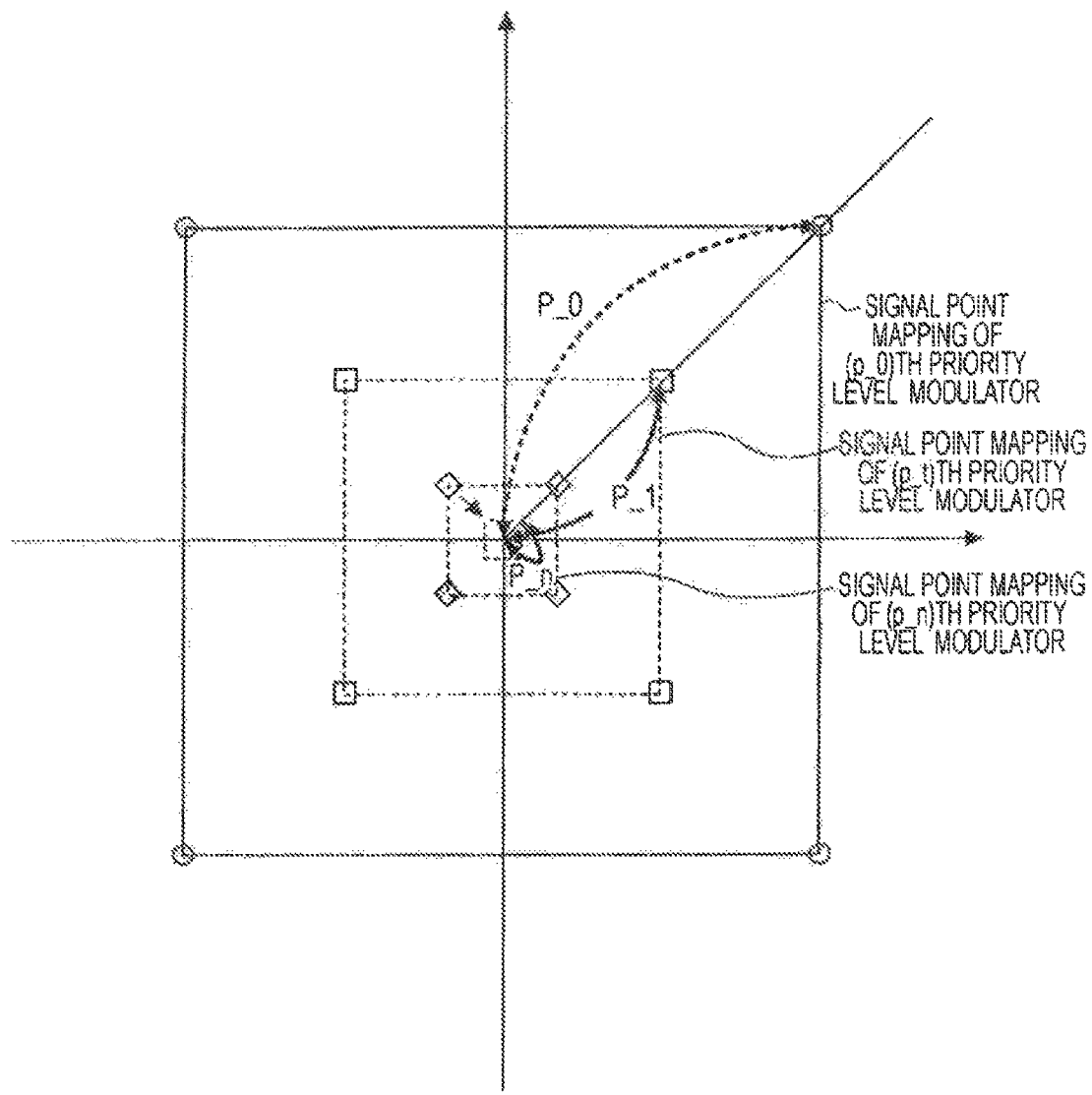
FIG. 9 is a diagram illustrating an example of mapping of signal points in a phase space when a multi-level QAM modulation is performed.

FIG. 9 is a diagram illustrating an example of mapping of signal points in a phase space when a multi-level QAM modulation is performed. The QAM modulation is a digital modulation method which uses amplitude and phase of a carrier. Weighting of a high amplitude level is performed on bit-series groups having decoding characteristics of high priority levels. Accordingly, as shown in FIG. 9, in the transmission streams, bit-series groups having high priority levels are mapped inward in the phase space from an outer line side in accordance with the priority levels. That is, FIG. 9 shows an example of signal mapping in a case where different bit-series groups are subjected to QPSK (quadrature-phase shift keying) modulation in different amplitude levels and are added to one another on an identical signal point, and a result of the addition is transmitted as a single stream. When compared with signal points corresponding to bit series items of high priority levels, signal points (corresponding to bit series items of lower priority levels) mapped so as to have small amplitudes in the decoding processes appear to be noise components or interference components.

Figure 10:
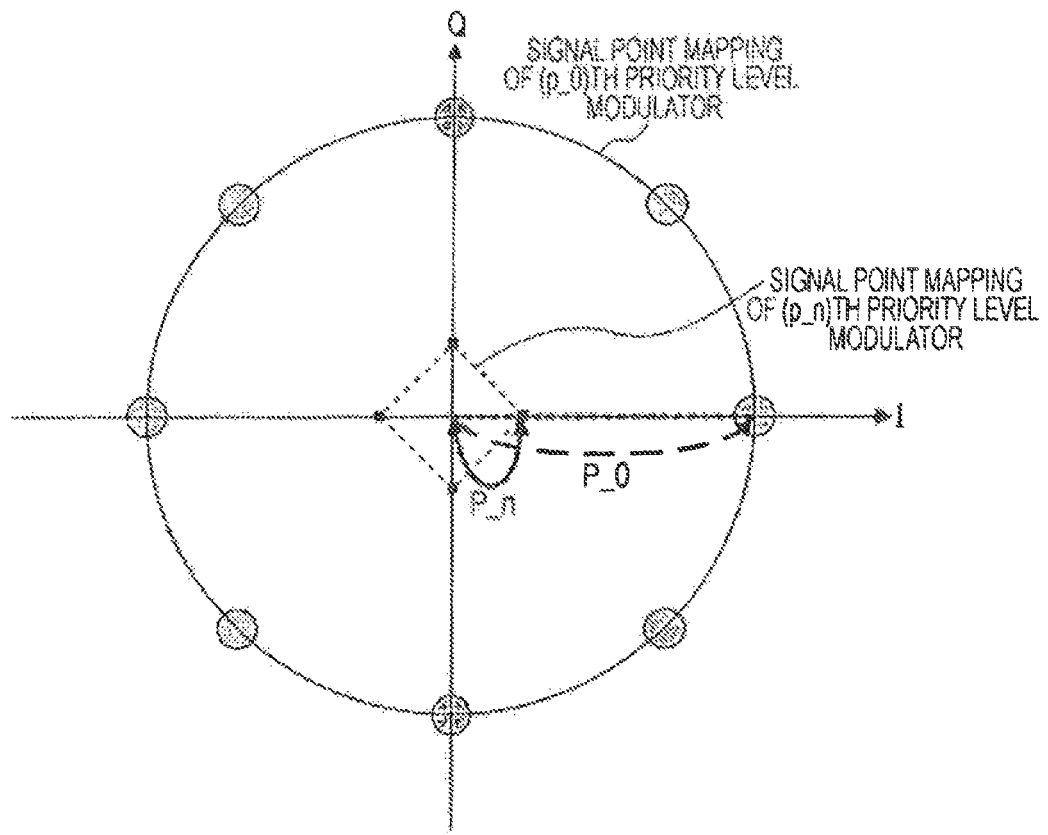
FIG. 10 is a diagram illustrating an example of mapping of signal points in a phase space when a multi-level PSK modulation is performed.

Furthermore, FIG. 10 is a diagram illustrating an example of mapping of signal points in a phase space when a multi-level PSK (phase shift keying) modulation is performed. The PSK modulation is a digital modulation method which only uses phase with constant modulation outputs, and BPSK (binary PSK) which uses two phases in order to represent bits, and QPSK (quadrature PSK) which uses four phases in order to represent bits are known. Weighting of a high amplitude level is performed on bit-series groups having decoding characteristics of high priority levels. Accordingly, as shown in FIG. 10, in the transmission streams, bit-series groups having high priority levels are mapped inward in the phase space from an outer line side in accordance with priority levels. That is, FIG. 10 shows an example of signal mapping in a case where different bit-series groups are subjected to multiphase modulation in different amplitude levels and are added to one another on an identical signal point, and a result of the addition is transmitted as a single stream. When compared with signal points corresponding to bit series items of high priority levels, signal points (corresponding to bit series items of lower priority levels) mapped so as to have small amplitudes in the decoding processes appear to be noise components or interference components.

Figure 11:
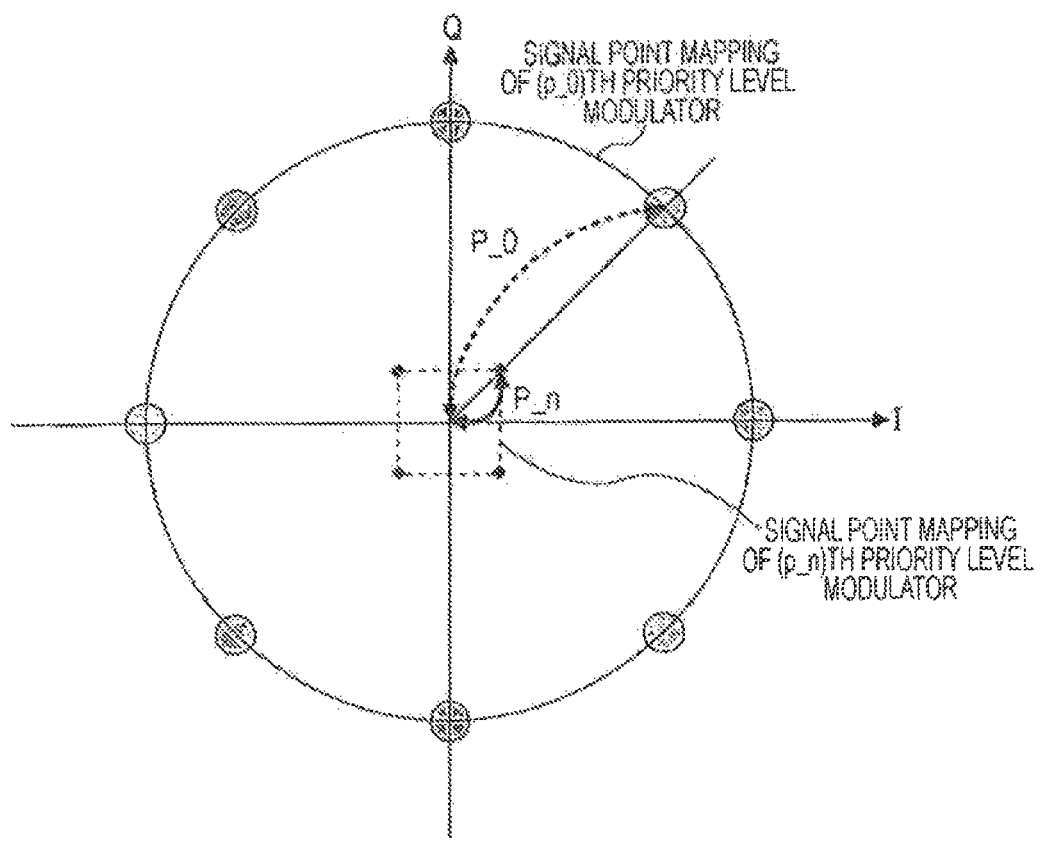
FIG. 11 is a diagram illustrating an example of mapping of signal points in a phase space when a multi-level PSK/QAM modulation is performed.

FIG. 11 is a diagram illustrating an example of mapping of signal points in a phase space when a multi-level PSK/QAM modulation is performed. Weighting of a high amplitude level is performed on bit-series groups having decoding characteristics of high priority levels, and accordingly, as shown in FIG. 11, in the transmission streams, bit-series groups having high priority levels are mapped inward in the phase space from an outer line side in accordance with the priority levels. That is, FIG. 11 shows an example of signal mapping in a case where different bit-series groups are subjected co the multiphase modulation or QAM modulation in different amplitude levels and are added to one another on an identical signal point, and a result of the addition is transmitted as a single stream. When compared with signal points corresponding to bit series items of high priority levels, signal points (corresponding to bit series items of lower priority levels) mapped so as to have small amplitudes in the decoding processes appear to be noise components or interference components. The modulation methods performed on the individual bit-series groups may not be identical, and FIGS. 9 to 11 are merely examples.

It should be understood by those skilled in the art that various modifications, combinations, sub-combinations and alterations may occur depending on design requirements and other factors insofar as they are within the scope of the appended claims or the equivalents thereof.

What is claimed is:
1. A wireless communication apparatus, comprising:
circuitry configured to, for each block of bits,
    encode each block according to an assigned encoding rate,
    modulate each respective encoded block according to an assigned modulation method according to a data attribute of the respective encoded block, wherein the assigned modulation method is different for each encoded block, and the encoded blocks are mapped to different signal points based on the assigned modulation methods, and
    weight, using a weight factor, each modulated block according to an assigned amplitude level and based on a priority level associated with the modulated block, wherein the assigned amplitude level is different for each modulated block, and weighting according to a higher amplitude level as the assigned amplitude level is performed on modulated blocks of higher priority levels while weighting according to a lower amplitude level as the assigned amplitude level is performed on modulated blocks of lower priority levels,
wherein the circuitry is further configured to
    generate a plurality of transmission streams, each individual transmission stream of the plurality of transmission streams being generated by performing data multiplexing by synthesizing at least two weighted blocks of the plurality of weighted blocks to form a single respective stream,
    up-convert through digital to analog (DA) conversion and radio frequency (RF) conversion into wireless signals, and
    transmit the plurality of transmission streams from a plurality of transmission antennas.
2. The wireless communication apparatus according to claim 1,
wherein the circuitry is further configured to transmit control information representing at least one of encoding methods, encoding rates, modulation methods, or amplitude levels.
3. A wireless communication apparatus, comprising:
circuitry configured to
    receive, using a plurality of receiving antennas, wireless signals transmitted through spatial multiplexing, down-convert the received wireless signals through radio frequency (RF) conversion and analog to digital (AD) conversion, spatially demultiplex the received signals so as to obtain a plurality of received streams, wherein each individual stream of the plurality of received streams that has been obtained through spatial demultiplexing is further data demultiplexed to obtain at least two separate bit-series of blocks that have, for each respective block of the blocks, been:

encoded according to an assigned encoding rate;

modulated, after the encoding, according to an assigned modulation method according to a data attribute of the respective block, wherein the assigned modulation method is different for each block, and the blocks have been mapped to different signal points based on the assigned modulation methods; and weighted, after the modulation, using a weight factor, according to an assigned amplitude level and based on a priority level associated with the modulated block, wherein the assigned amplitude level is different for each modulated block, and weighting according to a higher amplitude level as the assigned amplitude level is performed on modulated blocks of higher priority levels while weighting according to a lower amplitude level as the assigned amplitude level is performed on modulated blocks of lower priority levels, and decode and demodulate the received streams, the respective amplitude levels, the respective encoding rates, and the respective modulation methods of each of the blocks, wherein the circuitry is further configured to perform the demodulation and the decoding of the respective received streams sequentially according to the respective amplitude levels given that the other received streams with lower amplitude levels are noise.

4. The wireless communication apparatus according to claim 3, wherein the circuitry is further configured to receive control information representing at least one of encoding methods, encoding rates, modulation methods, or amplitude levels.

* * * * *